(12) United States Patent
Vogt et al.

(10) Patent No.: US 11,307,503 B2
(45) Date of Patent: Apr. 19, 2022

(54) SUPPORT OF AN OPTICAL UNIT

(71) Applicant: Carl Zeiss SMT GmbH, Oberkochen (DE)

(72) Inventors: Martin Vogt, Mutlangen (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/135,870

(22) Filed: Dec. 28, 2020

(65) Prior Publication Data
US 2021/0116823 A1 Apr. 22, 2021

Related U.S. Application Data

(63) Continuation of application No. PCT/EP2019/066818, filed on Jun. 25, 2019.

(30) Foreign Application Priority Data

Jul. 4, 2018 (DE) .......................... 102018210996.6

(51) Int. Cl.
*G03F 7/20* (2006.01)
*G02B 7/02* (2021.01)

(52) U.S. Cl.
CPC ........... *G03F 7/70833* (2013.01); *G02B 7/02* (2013.01); *G03F 7/70825* (2013.01); *G03F 7/70816* (2013.01)

(58) Field of Classification Search
CPC ............. G03F 7/70891; G03F 7/70808; G03F 7/70833; G03F 7/709; G03F 7/70825;
(Continued)

(56) References Cited

U.S. PATENT DOCUMENTS

2007/0263189 A1* 11/2007 Butler ................. G03F 7/70833
355/53
2009/0033895 A1* 2/2009 Binnard .................. G03F 7/709
355/53
(Continued)

FOREIGN PATENT DOCUMENTS

EP 1143492 A1 10/2001
WO WO 2013/017171 A1 2/2013

OTHER PUBLICATIONS

International Preliminary Report on Patentability (Chapter I of the Patent Cooperation Treaty) for related International Application No. PCT/EP2019/066818, dated Jan. 5, 2021, 6 pages.
(Continued)

*Primary Examiner* — Mesfin T Asfaw
(74) *Attorney, Agent, or Firm* — Fish & Richardson P.C.

(57) ABSTRACT

A microlithographic arrangement, for example using light in the extreme UV range, includes a supporting structure for supporting an optical unit, the mass of which can be 4 t to 14 t. The supporting structure includes a number of separate supporting units for supporting the optical unit. Each of the supporting units includes an air bearing unit by way of which a supporting force which counteracts the weight of the optical unit can be generated. The number of supporting units is at least four, at least two of the supporting units being coupled via a coupling device to form a supporting unit pair in such a way that the coupling device counteracts a deviation from a predeterminable ratio of the supporting forces of the two supporting units of the supporting unit pair.

20 Claims, 2 Drawing Sheets

(58) Field of Classification Search
CPC ....... G03F 7/70816; G02B 7/02; G02B 7/183; G02B 7/1827
See application file for complete search history.

(56) References Cited

U.S. PATENT DOCUMENTS

2009/0091733 A1    4/2009   Wada
2011/0043781 A1    2/2011   Ebihara et al.

OTHER PUBLICATIONS

Translation of International Search Report for corresponding PCT Appl No. PCT/EP2019/066818, dated Sep. 16, 2019.

* cited by examiner

SUPPORT OF AN OPTICAL UNIT

CROSS REFERENCE TO RELATED APPLICATIONS

The present application is a continuation of, and claims benefit under 35 USC 120 to, international application PCT/EP2019/066818, filed Jun. 25, 2019, which claims benefit under 35 USC 119 of German Application No. 10 2018 210 996.6, filed Jul. 4, 2018. The entire disclosure of these applications are incorporated by reference herein.

FIELD

The present disclosure relates to a microlithographic arrangement with a supporting structure for supporting an optical unit which is suitable for the use of UV exposure light, for example light in the extreme ultraviolet (EUV) range. The disclosure further relates to an optical imaging device with such an arrangement, a corresponding method for supporting an optical device and a corresponding optical imaging method. The disclosure can be used in conjunction with any desired optical imaging methods. It can be used in the production or the inspection of microelectronic circuits and the optical components used therein (for example optical masks).

BACKGROUND

The optical devices used in conjunction with the production of microelectronic circuits typically included a plurality of optical element units including one or more optical elements, such as lens elements, mirrors or optical gratings, which are disposed in the imaging light path. The optical elements typically cooperate in an imaging process in order to transfer an image of an object (for example a pattern formed on a mask) to a substrate (for example a so-called wafer). The optical elements are typically combined in one or more functional groups, which are possibly held in separate imaging units. In the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically include a supporting structure having a substantially ring-shaped outer supporting unit, which supports one or more optical element holders, which in turn hold the optical element.

The ever-advancing miniaturization of semiconductor components results in a constant desire for increased resolution of the optical systems used for their production. This desire for increased resolution involves the desire for an increased numerical aperture (NA) and an increased imaging accuracy of the optical systems.

One approach for obtaining an increased optical resolution is to reduce the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In this EUV range it is, in general, no longer possible to use conventional refractive optical systems. For example, in this EUV range the materials used for refractive optical systems typically have an absorbance that is too high to achieve acceptable imaging results with the available light power. Consequently, in this EUV range it is often desirable to use reflective optical systems for the imaging.

This transition to purely reflective optical systems having a high numerical aperture (e.g. NA>0.4 to 0.5) in the EUV range can result in considerable challenges with regard to the design of the imaging device.

An accuracy property is the accuracy of the position of the imaging on the substrate, which is often referred to as the so-called line-of-sight accuracy (LoS accuracy). The line-of-sight accuracy is typically scaled approximately with the inverse of the numerical aperture. Consequently, the line-of-sight accuracy in an imaging device with a numerical aperture of NA=0.45 may be smaller by a factor of 1.4 than in the case of an imaging device with a numerical aperture of NA=0.33. With a numerical aperture of NA=0.45, the line-of-sight accuracy is typically below 0.5 nm. If the imaging process is intended to allow so-called double structuring (typically referred to as double patterning), the line-of-sight accuracy is typically increased by a further factor of 1.4. As a result, the line-of-sight accuracy may be then below 0.3 nm.

The factors mentioned above typically result in very stringent properties with regard to the position and/or orientation of the optical elements participating in the imaging relative to one another and also with regard to the deformation of the individual optical elements in order to achieve a desired imaging accuracy. Moreover, it may be desirable to maintain this high imaging accuracy over operation in its entirety, ultimately over the lifetime of the system.

As a consequence, in general, the components of the optical imaging device (i.e., for example, the optical elements of the illumination device, the mask, the optical elements of the projection device and the substrate) which cooperate during the imaging are desirably supported in a well-defined manner in order to maintain a predetermined well-defined spatial relationship between these components and to obtain a minimal undesired deformation of these components in order to ultimately achieve the highest possible imaging quality.

With the aforementioned EUV systems, an issue may arise that, for system-related reasons, the illumination device and the projection device are relatively large and heavy optical units, which in newer systems can possibly reach a mass of 6 t to 8 t. However, in order to comply with the desired accuracy properties, these heavy units are desirably adjustable and, moreover, desirably should not experience undesired or not precisely defined deformations already due to the design of their mounting. For these reasons, so-called three-point mounting is typically used for mounting these optical units, as is also known for example from WO 2013/017171 A1 (Matzkovits, the entire disclosure of which is incorporated herein by reference).

With such a three-point mounting, a statically determined mounting can be achieved or a statically overdetermined mounting can be avoided, which would otherwise lead to undesired parasitic stresses and resultant deformations in the optical unit on account of production inaccuracies or deformations (which may be caused by mechanical disturbances such as vibrations).

Since the heavy optical system is also intended to be adjustable in order to achieve the desired precision, so-called air bearings are typically used for the three-point mounting, in which an air gap is built up between the bearing surfaces using compressed air (or another suitable gas). With these air bearings there may be the issue that their loading capacity is limited if the other boundary conditions (for example the dynamic boundary conditions) of such EUV systems are complied with. This loading capacity limit may be exceeded in the case of optical units of future EUV systems, the mass of which can reach 6 t to 8 t.

SUMMARY

The disclosure seeks to provide a microlithographic arrangement with a supporting structure for supporting an optical unit, a corresponding optical imaging device with such an arrangement, a corresponding method for supporting an optical device and a corresponding optical imaging method which can eliminate the aforementioned disadvantages, or at least can have them to a lesser extent, and for example achieve a support of the optical unit with the lowest possible parasitic stresses or deformations in a simple manner.

The disclosure involves the technical teaching that, when supporting such a heavy optical unit of the type mentioned at the beginning by way of air bearings, the introduction of parasitic stresses or deformations can be avoided to a substantial extent in a simple manner if a support by way of at least four separate supporting units is provided, two of which are coupled to form a supporting units pair in such a way that a deviation from a predeterminable ratio of their supporting forces is counteracted. The fourth (and possibly every further) supporting unit on the one hand reduces the load per air bearing in a simple manner and thus allows their use even with such heavy optical units. In addition, the coupling of the two supporting units of the supporting unit pair can ensure in a simple manner that compensation for deviations in the position and/or alignment at the two supporting points from their intended state is provided in a simple manner and thus there is always the setpoint ratio of the two supporting forces of the supporting unit pair. Such deviations may be caused by manufacturing inaccuracies, but also only arise during operation due to deformations caused by malfunctions.

In other words, the present coupling of the supporting units achieves a master-slave configuration in which the imbalance of the two supporting forces (i.e. their deviation from their setpoint ratio) is compensated by a compensating movement provided by way of the coupling device at the two supporting points, and thus the equilibrium of the two supporting forces (hence therefore their setpoint ratio) is established. Ultimately, in the optimum case, it can thus be achieved that the supporting unit pair behaves as a single supporting unit, and thus ultimately once again a three-point mounting is implemented, by way of which a statically determined support can be achieved.

The coupling and the compensating movement caused by it on the two supporting units of the supporting unit pair can be implemented in the most varied of ways. A purely passive coupling is just as possible as a coupling actively controlled by a control device. The ratio of the two supporting forces of the supporting unit pair may in principle be selected as whatever is suitable. The only limiting factor here is, in general, the maximum force $F_{max}$ that can be absorbed via each of the supporting units or their air bearings. Therefore, the relief provided by the additional fourth supporting unit (compared to a conventional three-point mounting with three supporting units) is so great that this maximum force $F_{max}$ is not reached at the other supporting units (in all involved operating states). Dynamic states may possibly also be taken into account, since air bearings are often also subject to restrictions with regard to the ratio of the maximum to the minimum bearing force during operation.

It goes without saying that the disclosure may in principle be used in connection with any optical units. For example, configurations can have significantly lighter optical units. However, it can be used in designs in which the mass of the optical unit is more than 4 t (e.g., more than 6 t, or more than 8 t). It can be used in designs in which the mass of the optical unit is 4 t to 14 t (e.g., 5 t to 10 t, or 6 t to 8 t).

According to an aspect, the disclosure therefore relates to a microlithographic arrangement, for example using light in the extreme UV range (EUV), with a supporting structure for supporting an optical unit whose mass is 4 t to 14 t (e.g., 5 t to 10 t or 6 t to 8 t). The supporting structure includes a number of separate supporting units for supporting the optical unit. Each of the supporting units includes an air bearing, by way of which a supporting force which counteracts the weight of the optical unit can be generated. The number of supporting units is at least four, at least two of the supporting units being coupled via a coupling device to form a supporting unit pair in such a way that the coupling device counteracts a deviation from a predeterminable ratio of the supporting forces of the two supporting units of the supporting unit pair.

The ratio of the two supporting forces of the supporting units may in principle be chosen as desired and adapted to the geometric conditions and the mass distribution (hence therefore also the position of the center of gravity) of the optical unit. For example, the dynamic conditions during operation of the arrangement can also be taken into account. Under static conditions, it may typically be desirable if the ratio of the supporting forces is 1, since the loads are then distributed as evenly as possible. If, however, one of the supporting units experiences a greatly increased supporting force under dynamic conditions (for example due to vibration excitation), it can make sense to reduce the latter under static conditions in order to reduce the dynamic maximum amount (and of course to keep it below the maximum force $F_{max}$).

In certain variants, the predeterminable ratio V of the supporting forces is ⅓ (or approx. 0.33) to 1/1 (or 1) (e.g., ½ (or 0.5) to 1/1 (or 1), ⅔ (or approx. 0.66) to 1/1 (or 1), ¾ (or 0.75) to 1/1 (or 1), or ⅘ (or 0.8) to 1/1 (or 1)). This allows particularly favorable load distributions over the supporting units to be achieved. Additionally or alternatively, the coupling device may be configured to at least substantially equalize the amount of the supporting forces of the two supporting units of the supporting unit pair. The coupling device may also be configured to minimize a deviation between the amounts of the supporting forces of the two supporting units. In both of the latter cases, it is hence therefore attempted to achieve a ratio of the supporting forces of V=1.

It goes without saying that a particularly close approximation to the respective setpoint value of the supporting force may be desirable. In the case of forces that are as far as possible of equal magnitude (ratio of 1), the aim is then of course that the amounts of the two supporting forces of the supporting unit pair are identical. A first supporting unit of the supporting unit pair therefore can be configured to exert a first supporting force, while a second supporting unit of the supporting unit pair is configured to exert a second supporting force. The coupling device is then configured in such a way that the amount of the first supporting force deviates by less than 1.0% (e.g., less than 0.5%, less than 0.1%), from the amount of the second supporting force. If the ratio V of the supporting forces is not equal to 1, the aforementioned deviation then may apply to the deviation of the respective supporting force from its respective setpoint value (according to the respective ratio).

The compensating movement for the equilibrium of forces between the two supporting forces may in principle be generated in any suitable manner. A first supporting unit of the supporting unit pair may have a first air bearing unit for generating a first supporting force, while a second supporting unit of the supporting unit pair has a second air bearing unit for generating a second supporting force. The coupling device has a first coupling unit, which carries the first air bearing unit displaceably at least along the first supporting force. Furthermore, the coupling device has a second coupling unit, which carries the second air bearing unit displaceably at least along the second supporting force. The first coupling unit and the second coupling unit are coupled to one another in such a way that a first displacement along the first supporting force on the first air bearing unit brings about an opposite second displacement along the second supporting force on the second air bearing unit. In this way, the respective compensating movement can be implemented in a particularly simple manner.

Depending on the ratio of the two supporting forces, different displacements can result. In certain variants with a ratio of 1, it can be provided that the amount of the first displacement is at least substantially equal to the amount of the second displacement. The connection of the coupling unit to the respectively associated air bearing unit may in principle be designed as desired. For example, it may be provided that involved movements of the mounting in certain degrees of freedom during the compensating movement are already made available by the air bearing unit. In certain variants, however, such movements may also take place by way of the respective connection of the coupling unit to its associated air bearing unit. Thus, the respective coupling unit may be connected to the associated air bearing unit by way of a pivot bearing, for example one of the two pivot bearings restricting exactly three translational degrees of freedom and the other of the two pivot bearings restricting exactly one translational degree of freedom. In this way, a typical arrangement including a fixed bearing and a floating bearing can be implemented in the coupling device.

The coupling between the supporting units of the supporting unit pair may in principle take place according to any suitable operating principles which provide the desired compensating movement (alone or in any combination). It may be a hydraulic, purely mechanical or electronic coupling (alone or in any combination).

In certain variants, the coupling device may therefore be a hydraulic coupling device. Such a hydraulic coupling can have the property that it can be implemented particularly easily by way of one or more hydraulic lines. For example, it may be provided that the first coupling unit is a first piston-cylinder unit with a first hydraulic working space, while the second coupling unit is a second piston-cylinder unit with a second hydraulic working space. The first hydraulic working space and the second hydraulic working space are then simply hydraulically coupled to one another.

Depending on the ratio to be achieved between the supporting forces of the two supporting units of the supporting unit pair, this can be achieved simply by way of the effective piston area of the respective piston-cylinder unit. For example in the case of the cited variants with a ratio of the supporting forces of 1, it may be provided that the two piston-cylinder units have an at least substantially identical effective piston area.

The hydraulic coupling may take place in any suitable manner. The first hydraulic working space and the second hydraulic working space may be coupled to one another by way of at least one hydraulic line. A particularly simple coupling can be achieved thereby.

Furthermore, a throttle device may be provided between the first and second hydraulic working spaces in order to achieve a throttling of the hydraulic medium and thus a damping of the compensating movement. This throttling may be fixed in advance. The throttling may however also be actively adjustable by the throttling device. For example, a number of hydraulic lines, which can be selectively switched on and off in order to change the entire flow cross section of the connection between the working spaces and thus the throttling, may be provided between the working spaces.

The coupling may be implemented purely passively, just by the hydraulic connection of the working spaces. Alternatively, however, the coupling device may also include a pumping device for actively filling the first and second hydraulic working spaces. In this way, possibly also suitable reactions to certain dynamic states during operation that involve a different ratio between the supporting forces of the supporting unit pair can then be achieved.

In further variants, the coupling device is a mechanical coupling device. This also allows particularly simple configurations to be achieved. The first coupling unit may be a first arm of a rocker unit, while the second coupling unit is a second arm of the rocker unit. The first arm and the second arm are connected to one another in the region of a pivot bearing of the rocker unit. A particularly simple and reliable mechanical coupling of the two supporting units can thereby be achieved.

The connection between the first arm and the second arm may in principle be designed as desired, as long as the correspondingly desired compensating movement is achieved. In variants, because they are particularly simple, the first arm and the second arm are combined in one piece.

The pivot bearing of the rocker unit may in principle be designed in any suitable manner. Here, too, in principle involved movements of the mounting in certain degrees of freedom during the compensating movement can already be made available by the air bearing unit. The pivot bearing of the rocker unit may restrict three translational degrees of freedom and two rotational degrees of freedom, since this achieves a particularly simple configuration. In other words, the pivot bearing of the rocker unit may be formed in the manner of a fixed bearing.

The position of the pivot bearing of the rocker unit may in principle be selected as desired, it being possible to adapt it in a simple manner to the geometric conditions of the optical unit. The pivot bearing of the rocker unit may be arranged in the region of a connecting line of the pivot bearings of the coupling units. This largely avoids unwanted parasitic movements in the region of the pivot bearings of the coupling units. This is particularly true when the pivot axis of the pivot bearing of the rocker unit intersects this connecting line of the pivot bearings of the coupling units.

In this design too, damping of the compensating movements on the supporting units can once again be provided. For this purpose, the rocker unit may include a damping device for damping the pivoting movement about the pivot bearing of the rocker unit. It may once again be provided, for example, that the damping value of the damping device is adjustable.

It goes without saying that the mechanical coupling device described above may be a purely passive device. It is of course similarly conceivable that the coupling device is an active device in which the compensating movements on the supporting units are actively influenced. For example, the damping device described above may correspondingly be formed as being active.

In certain variants, the coupling device is an active coupling device. This may be desirable for example when it is intended that there should be a selective reaction to certain dynamic operating states of the arrangement. The design as an active coupling device may in principle be implemented in any suitable manner. Any active components which actively generate the compensating movements on the supporting units according to any operating principles may be provided.

In certain variants, the first coupling unit includes a first actuator unit, which is connected to a control device, while the second coupling unit includes a second actuator unit, which is likewise connected to the control device. The control device then controls the first and the second actuator unit for setting the first and second supporting forces.

The control may be formed both with and without a closed control loop. For example, it may thus be provided that the first actuator unit and the second actuator unit respectively include a force actuator controlled by the control device (for example a Lorentz actuator), which generates a force specified (by an input signal) in dependence on the input signal. In this case, an open control loop may be implemented, and hence therefore it may simply be provided that the control device merely specifies an input signal for the force actuator, on the basis of which the force actuator sets the desired force. In this case, the force actuator may either generate the desired supporting force on the supporting unit of the supporting unit pair directly or make it available by way of a corresponding transmission ratio.

In the case of such active coupling devices, too, it may once again be provided that the supporting structure includes a damping device for damping the movements of the optical unit generated by the actuator units. Here too, the damping value of the damping device may once again be designed to be adjustable. The damping device may be provided at any suitable point in the force flow between the supporting structure and the optical unit. For example, the damping device may be connectable to the optical unit. For example, this applies not only to the active coupling devices just described, but in general to all of the coupling devices described above and below, regardless of their operating principle and general design.

Such a damping device can, for example, desirably influence the dynamic properties of the optical unit independently of the operating principle and general design of the coupling device. One or more resonant frequencies of the optical unit can be influenced or damped by way of such a damping device.

In certain variants of the active coupling device, it may be provided that the control device controls the actuator units using a damping parameter to dampen the movements of the optical unit generated by the actuator units. Here too, the damping parameter may for example be adjustable.

In further variants of the active coupling device, a closed control loop may be provided. For this purpose, it may be provided for example that the control device is connected to a first detection unit, which is configured to detect at least one first detection value assigned to the first coupling unit. Furthermore, the control device is then connected to a second detection unit which is configured to detect at least one second detection value assigned to the second coupling unit. The respective detection value may be representative of a position of the assigned coupling unit along the direction of the assigned supporting force and/or an amount of the assigned supporting force and/or an air gap of the assigned air bearing unit. The control device is then further configured to control the first and second actuator units in dependence on the first and second detection values.

It goes without saying that the two supporting units of the supporting unit pair may in principle act at any suitable point on the optical unit. In certain variants, the optical unit has a center of gravity, the gravitational force of the optical unit and the supporting forces of the supporting units respectively intersecting a horizontal plane at a force intersection. At least the supporting unit whose force intersection in the horizontal plane is at the smallest distance from the force intersection of the gravitational force forms one of the two supporting units of the at least one supporting unit pair. This makes it possible to ensure in a simple manner that precisely the supporting unit which is closest to the center of gravity of the optical unit, and therefore in principle is exposed to the highest load, is effectively relieved by the assigned second supporting unit.

In addition, it may be provided that the supporting unit whose force intersection in the horizontal plane is at the second smallest distance from the force intersection of the gravitational force forms the other of the two supporting units of the at least one supporting unit pair. In this way, particularly effective relief of the air bearings can be achieved.

The arrangement or relative position of the supporting units of the supporting unit pair over the circumference of the optical unit may in principle also be selected as desired. The optical unit may define a circumferential direction in the horizontal plane and the force intersections of the two supporting units of the at least one supporting unit pair are directly adjacent to one another in the circumferential direction.

It goes without saying that in principle any number of supporting units may be provided, coupled to one another by way of corresponding coupling devices in order in the end to reproduce the support of the optical unit in the manner of a three-point support. In this case, the coupling devices may also be arranged in a cascaded manner, for example therefore the coupling devices of two pairs of supporting units may in turn be coupled by way of a corresponding coupling device.

In certain, particularly simple variants, the number of supporting units is exactly four. Alternatively, the number of supporting units may be at least five, for example exactly five, in which case a further supporting unit pair separate from the supporting unit pair is provided. Furthermore, the number of supporting units may alternatively be exactly six, in which case two further supporting unit pairs separate from the supporting unit pair and from one another are provided. In both cases, these additional supporting unit pairs may then be formed identically to the supporting unit pair described above.

The present disclosure further relates to an optical imaging device, for example for microlithography, with an illumination device with a first optical element group, an object device for recording an object, a projection device with a second optical element group and an image device. The illumination device is designed to illuminate the object, while the projection device is designed to project an image of the object onto the image device. The illumination device and/or the projection device includes at least one arrangement according to the present disclosure. This makes it possible to achieve the variants and features described above in connection with the arrangement according to the disclosure to the same extent, and so reference is made to the explanations given above in this respect.

The present disclosure further relates to a method for supporting an optical microlithographic unit, for example using light in the extreme UV range (EUV), via a supporting structure, the optical unit being supported via a number of separate supporting units of the supporting structure by each the supporting units generating by way of an air bearing a supporting force which counteracts the weight of the optical unit. Here too, the mass of the optical unit may for example be 4 t to 14 t (e.g., 5 t to 10 t, 6 t to 8 t). The number of supporting units is at least four, at least two of the supporting units being coupled by way of a coupling device to form a supporting unit pair in such a way that the coupling device counteracts a deviation from a predeterminable ratio of the two supporting forces of the two supporting units of the supporting unit pair. This makes it possible in turn to achieve the variants and features described above in connection with the arrangement according to the disclosure to the same extent, and so reference is made to the explanations given above in this respect.

The present disclosure finally relates to an optical imaging method, for example for microlithography, in which an object is illuminated by way of an illumination device with a first optical element group and an image of the object is generated on an image device via a projection device with a second optical element group. A method according to the disclosure for supporting an optical unit is used in the illumination device and/or the projection device, for example while generating the imaging. This makes it possible also to achieve the variants and features described above in connection with the arrangement according to the disclosure to the same extent, and so reference is made to the explanations given above in this respect.

Further aspects and exemplary embodiments of the disclosure are evident from the dependent claims and the following description of exemplary embodiments, which relates to the accompanying figures. All combinations of the disclosed features, irrespective of whether or not they are the subject of a claim, lie within the scope of protection of the disclosure.

DESCRIPTION OF EXEMPLARY EMBODIMENTS

First Embodiment

Figure 1:
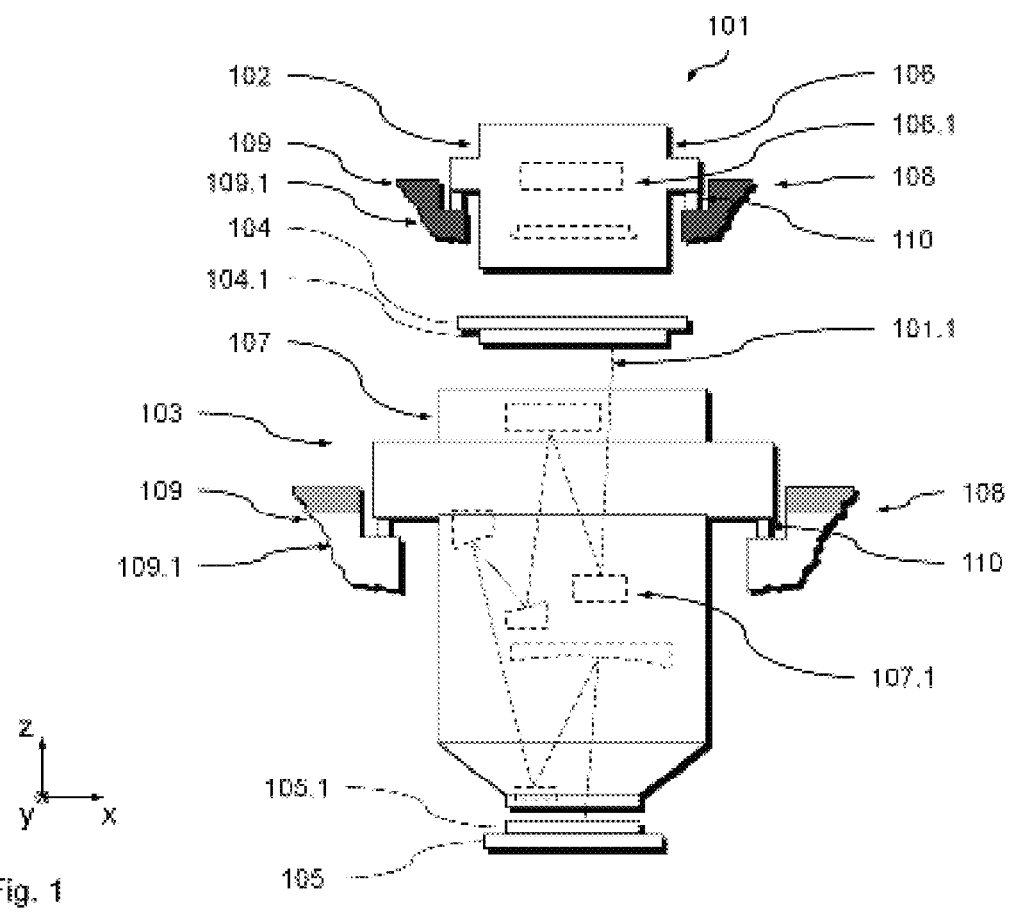
FIG. 1 is a schematic representation of an embodiment of a projection exposure apparatus according to the disclosure, which includes an embodiment of an arrangement according to the disclosure and with which embodiments of the methods according to the disclosure can be carried out.

An embodiment of a microlithographic projection exposure apparatus 101 according to the disclosure, which includes an embodiment of an arrangement according to the disclosure for supporting an optical unit, is described below with reference to FIGS. 1 to 4. To simplify the following explanations, an x, y, z coordinate system is indicated in the drawings, the z direction corresponding to the direction of gravitational force. It goes without saying that it is possible in further configurations to choose any desired other orientations of an x, y, z coordinate system.

FIG. 1 is a schematic, not-to-scale representation of the projection exposure apparatus 101, which is used in a microlithographic process for producing semiconductor components. The projection exposure apparatus 101 includes an illumination device 102 and a projection device 103. The projection device 103 is designed to transfer an image of a structure of a mask 104.1, which is disposed in a mask unit 104, onto a substrate 105.1, which is disposed in a substrate unit 105, in an exposure process. For this purpose, the illumination device 102 illuminates the mask 104.1. The optical projection device 103 receives the light from the mask 104.1 and projects the image of the mask structure of the mask 104.1 onto the substrate 105.1, such as for example a wafer or the like.

The illumination device 102 includes an optical unit 106 with an optical element group 106.1. The projection device 103 includes a further optical unit 107 with an optical element group 107.1. The optical element groups 106.1, 107.1 are disposed along a folded optical axis 101.1 of the projection exposure apparatus 101. Each of the optical element groups 106.1, 107.1 may include a plurality of optical elements.

In the present exemplary embodiment, the projection exposure apparatus 101 operates with exposure light in the EUV range (extreme ultraviolet radiation), with wavelengths of between 5 nm and 20 nm, for example with a wavelength of 13 nm. The optical elements of the element groups 106.1, 107.1 of the illumination device 102 and the projection device 103 are therefore exclusively reflective optical elements. For system-related reasons, the optical units 106 and 107 are heavy components, the mass of which is approximately 6 t to 8 t. In further variants, the mass of the optical units 106 or 107 may be 4 t to 14 t (e.g., 5 t to 10 t or 6 t to 8 t). The optical units 106 and 107 are respectively supported by way of an embodiment of the arrangement 108 according to the disclosure. In further configurations of the disclosure, it is of course also possible (for example depending on the wavelength of the illumination light) to use any type of optical elements (refractive, reflective, diffractive) alone or in any desired combination for the other optical modules. Furthermore, the illumination device 102 and/or the projection device 103 may include one or more optical units such as the optical unit 106 or 107.

The arrangement 108 is described below by way of example on the basis of the arrangement 108 which supports the optical unit 106. It goes without saying that the following statements also apply to the arrangement 108 which supports the optical unit 107. This may for example be designed identically to the arrangement 108 described below.

Figure 2:
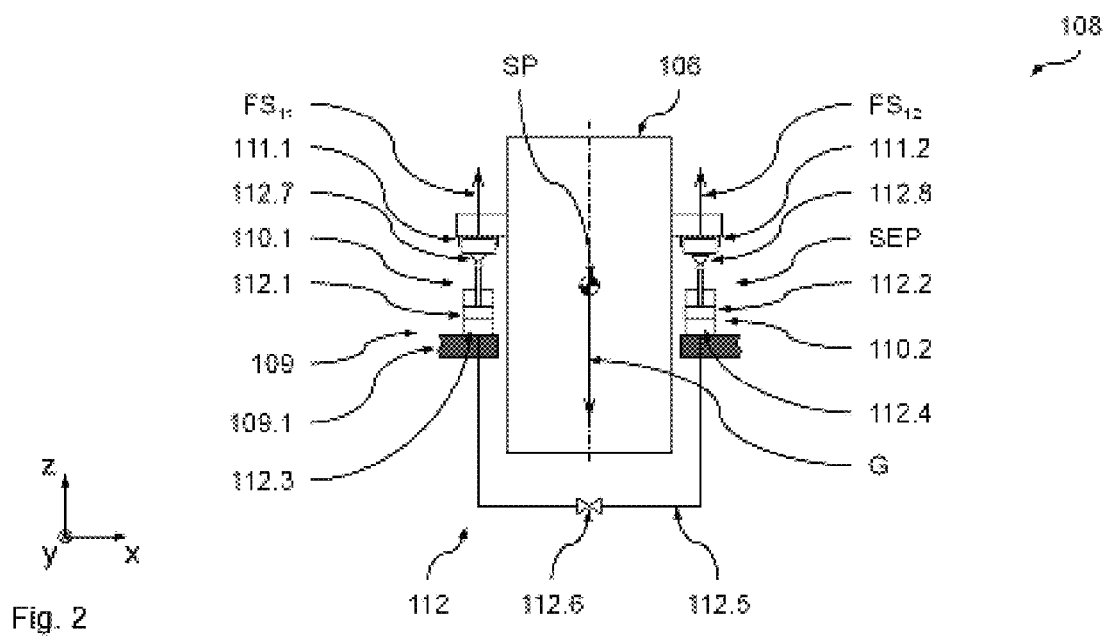
FIG. 2 is a schematic side view of the arrangement according to the disclosure from FIG. 1.
Figure 3:
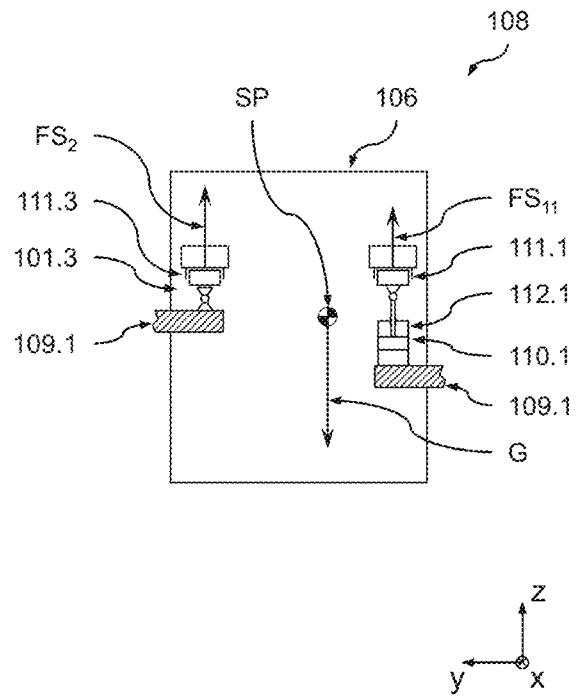
FIG. 3 is a further schematic side view of the arrangement from FIG. 2.

FIGS. 2 and 3 respectively show schematic side views (FIG. 2: onto the xz plane or along the y axis; FIG. 3: onto the yz plane or along the x axis) of the arrangement 108 which supports the optical unit 106, while FIG. 4 shows a schematic plan view (onto the yz plane or along the z axis) of the arrangement 108.

Figure 4:
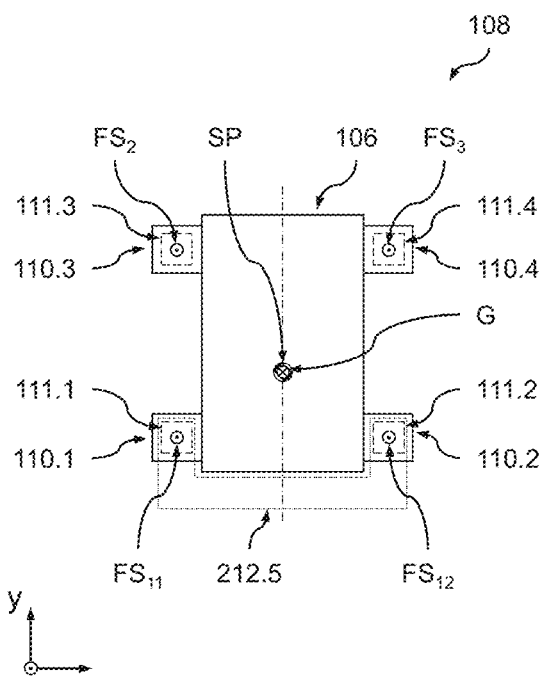
FIG. 4 is a schematic plan view of the arrangement from FIG. 2.

As can be seen from FIGS. 2 to 4, the arrangement 108 includes a supporting structure 109 for supporting the optical unit 106 on one or more supporting units 109.1, for example a supporting frame 109.1, of the supporting structure 109, which in turn is supported on a floor structure (not shown) in any suitable (and sufficiently well-known) manner.

The supporting structure 109 includes a number of separate supporting units 110, specifically exactly four supporting units 110.1 to 110.4, for supporting the optical unit 106. Each of the supporting units 110.1 to 110.4 includes an air bearing unit in the form of an air bearing 111.1 to 111.4. These air bearings 111.1 to 111.4 are designed in a sufficiently well-known manner (and so will not be discussed in more detail). An assigned supporting force $FS_{11}$, $FS_{12}$, $FS_2$ or $FS_3$, which counteracts the gravitational force G of the optical unit 106, can be respectively generated by way of each air bearing 111.1 to 111.4.

A first supporting unit 110.1 and a second supporting unit 110.2 are in this case coupled by way of a coupling device 112 to form a supporting unit pair SEP. The coupling is such that the coupling device 112 counteracts a deviation of the assigned supporting forces $FS_{11}$ and $FS_{12}$ from a predeterminable ratio V of the supporting forces $FS_{11}$ and $FS_{12}$ of the two supporting units 110.1 and 110.2, as will be described in detail below.

The ratio V of the two supporting forces $FS_{11}$ and $FS_{12}$ of the supporting units 110.1 and 110.2 may in principle be selected as desired and adapted to the geometric conditions and the mass distribution (hence therefore also the position of the center of gravity SP) of the optical unit 106. For example, the dynamic conditions during the operation of the imaging device 101, and thus the arrangement 108, can also be taken into account. Under static conditions, it can typically be desirable if the ratio of the supporting forces is V=1, since the loads are then distributed as evenly as possible. If, however, one of the supporting units 110.1 to 110.4 experiences a greatly increased supporting force under dynamic conditions (for example due to vibration excitation), it can make sense to reduce the latter under static conditions in order to reduce the dynamic maximum amount $FS_{max}$ (and of course to keep it below the maximum force $F_{max}$).

In the present example, the ratio of the supporting forces $FS_{11}$ and $FS_{12}$ in the static state (hence therefore in the rest state of the imaging device 101) is V=1. It goes without saying, however, that in other variants the predeterminable ratio of the supporting forces is ⅓ (or approx. 0.33) to 1/1 (or 1) (e.g., ½ (or 0.5) to 1/1 (or 1), ⅔ (or approx. 0.66) to 1/1 (or 1)), in order to achieve particularly favorable load distributions over the supporting units 110.1 to 110.4 depending on the application.

Accordingly, the coupling device 112 in the present example is configured to at least substantially equalize the amount of the supporting forces $FS_{11}$ and $FS_{12}$ of the two supporting units 110.1 and 110.2 of the supporting unit pair SEP, hence therefore a deviation DFS between the amounts of the supporting forces $FS_{11}$ and $FS_{12}$ of the two supporting units 110.1 and 110.2 (in the optimum case therefore to achieve a deviation DFS=0).

It goes without saying that a particularly close approximation to the respective setpoint value of the supporting force may be desirable. The coupling device 112 is consequently configured in such a way that the amount of the first supporting force $FS_{11}$ deviates by less than 1.0% (e.g., less than 0.5%, less than 0.1%) from the amount of the second supporting force $FS_{12}$.

In order to achieve the described equilibrium of forces between the two supporting forces $FS_{11}$ and $FS_{12}$, the coupling device 112 in the present example generates a compensating movement in the region of the air bearings 111.1 and 111.2, and so there is the same gap width of the air gap with the same bearing pressure (air pressure in the air gap). For this purpose, the coupling device 112 is designed as a hydraulic coupling device. To this end, the coupling device 112 has a first coupling unit in the form of a first piston-cylinder unit 112.1, which carries the first air bearing unit 111.1 displaceably along the first supporting force $FS_1$. Furthermore, the coupling device 112 has a second coupling unit in the form of a second piston-cylinder unit 112.2, which carries the second air bearing unit 111.2 displaceably along the second supporting force $FS_{12}$.

The first coupling unit 112.1 and the second coupling unit 112.2 are coupled to one another in such a way that a first displacement DS1 along the first supporting force $FS_{11}$ on the first air bearing unit 111.1 brings about an opposite second displacement DS2 along the second supporting force $FS_{12}$ on the second air bearing unit 111.2.

It goes without saying that, depending on the ratio V of the two supporting forces, different displacements DS1 and DS2 can result. In the present example with a ratio of V=1, the amount of the first displacement DS1 is at least substantially equal to the amount of the second displacement DS2.

In the present example, the hydraulic coupling is implemented by the (first) hydraulic working space 112.3 of the first coupling unit 112.1 being hydraulically coupled to the (second) hydraulic working space 112.4 of the second coupling units 112.2 by way of a simple hydraulic line 112.5.

Depending on the ratio V to be achieved between the supporting forces $FS_{11}$ and $FS_{12}$ of the two supporting units 110.1 and 110.2 of the supporting unit pair SEP, this can be achieved simply by way of the effective piston area of the respective piston-cylinder unit 112.1 and 112.2. In the present example with a ratio V=1, the two piston-cylinder units 112.1 and 112.2 accordingly have an at least substantially identical effective piston area. In the present example, a throttle device 112.6 is also provided in the hydraulic line 112.5 between the first and second hydraulic working spaces 112.3, 112.4 in order to achieve a throttling of the hydraulic medium and thus a damping of the compensating movement. This throttling may be fixed in advance. It may however also be actively adjustable by the throttling device 112.6. Furthermore, in further variants, a number of hydraulic lines, which can be selectively switched on or off (for example by way of the throttle device 112.6), in order to change the entire flow cross section of the connection between the working spaces 112.3, 112.4 and thus the throttling, may be provided between the working spaces 112.3, 112.4.

In the present example, the hydraulic coupling is implemented purely passively by the hydraulic connection of the working spaces 112.3 and 112.4. Alternatively, the coupling device 112 may also include (in addition or as an alternative to the throttle device 112.6) a pumping device for actively filling the first and second hydraulic working spaces 112.3, 112.4. In this way, possibly also suitable reactions to certain dynamic states during operation that involve a different ratio V between the supporting forces $FS_{11}$ and $FS_{12}$ of the two supporting units 110.1 and 110.2 of the supporting unit pair SEP can also be achieved.

The connection of the respective coupling unit 112.1, 112.2 to the respectively associated air bearing unit 111.1, 111.2 may in principle be designed as desired. For example, it may be provided that involved movements of the bearing in certain degrees of freedom during the compensating movement are already made available by the air bearing unit 111.1 or 111.2. In certain variants, however, such movements may also take place by way of the respective connection of the coupling unit 112.1, 112.2 to its associated air bearing unit 111.1, 111.2.

In the present example, the respective coupling unit 112.1 or 112.2 is connected to the associated air bearing unit 111.1 or 111.2 by way of a pivot bearing 112.7 or 112.8. The pivot bearing 112.7 in this case restricts exactly three translational degrees of freedom, while it does not restrict the other three degrees of freedom in space. The pivot bearing 112.8 restricts exactly one translational degree of freedom, while it does not restrict the other five degrees of freedom in space. This can ultimately result in a desirable arrangement including a fixed bearing and a floating bearing in the coupling device 112. This coupling of the two supporting units 110.1 and 110.2 to form a supporting unit pair SEP allows the support of the optical unit 106 to behave mechanically like a statically determined three-point support despite the four supporting units 110.1 to 110.4. Thus, despite the four supporting points, the introduction of parasitic stresses or deformations into the optical unit 106 can at least largely be avoided. Because four supporting units 110.1 to 110.4 are provided, on the one hand the load per air bearing 111.1 to 111.4 resulting from the weight G of the optical unit 106 is reduced in a simple manner and thus allows the use of such air bearings 111.1 to 111.4 even with such a heavy optical unit 106.

In addition, the coupling of the two supporting units 110.1 and 110.2 of the supporting unit pair SEP ensures in a simple manner that deviations in position and/or alignment at the two supporting points 110.1 and 110.2 from their intended state are easily compensated, and thus there is always the setpoint ratio V (in the present example V=1) of the two supporting forces $FS_{11}$ and $FS_{12}$ of the supporting unit pair SEP. Such deviations may be caused by manufacturing inaccuracies, but also arise only during operation due to deformations of the frame structure 109.1 and/or the structure of the optical unit 106 caused by disturbances.

In other words, the present coupling of the supporting units 110.1 and 110.2 by way of the coupling device 112 provides a master-slave configuration in which an imbalance of the two supporting forces (i.e. their deviation from their setpoint ratio) is compensated by a compensating movement provided by way of the coupling device 112, and thus the equilibrium of the two supporting forces $FS_{11}$ and $FS_{12}$ (hence therefore their setpoint ratio V) is established. Ultimately, in the optimum case, it can thus be achieved that the supporting unit pair SEP behaves as a single supporting unit, and thus ultimately once again a three-point mounting is implemented, by way of which a statically determined support of the optical unit 106 can be achieved.

It should be again be noted that the ratio of the two supporting forces $FS_{11}$ and $FS_{12}$ of the supporting unit pair SEP may in principle be selected as whatever is suitable. The only limiting factor here is the maximum force $F_{max}$ that can be accommodated by each of the supporting units 110.1 to 110.4 or their air bearings 111.1 to 111.4. Therefore, the relief provided by the additional fourth supporting unit (compared to a conventional three-point mounting with three supporting units) is so great that this maximum force $F_{max}$ is not reached at the other supporting units (in all desired operating states). Dynamic states are possibly also taken into account, since the air bearings 111.1 to 111.4 are often also subject to restrictions with regard to the ratio of the maximum bearing force $FS_{max}$ to the minimum bearing force $FS_{min}$ during operation.

It goes without saying that the two supporting units 110.1 and 110.2 of the supporting unit pair SEP may in principle act on the optical unit 106 at any suitable point. In the present example, the weight G of the optical unit 106 and the supporting forces $FS_{11}$ to $FS_3$ of the supporting units 110.1 to 110.4 intersect a horizontal plane (drawing plane of FIG. 4) respectively at a force intersection, the force intersection of the two supporting units 110.1 and 110.2 in the horizontal plane being at the smallest distance from the force intersection of the gravitational force G. This makes it possible to ensure in a simple manner that the supporting units 110.1 and 110.2 which are closest to the center of gravity SP of the optical unit 106, and therefore in principle are exposed to the highest load, are effectively relieved by the associated supporting unit 110.2 and 110.1, respectively.

Furthermore, the supporting units 110.1 and 110.2 of the supporting unit pair SEP are arranged in such a way that their force intersections in the horizontal plane in the circumferential direction of the optical unit 106 are directly adjacent to one another. With the design described above, a corresponding embodiment of the method according to the disclosure for supporting the optical unit 106, which is used during the imaging method with which the image of the mask structure of the mask 104.1 is projected onto the substrate 105.1, can be implemented during operation of the imaging device 101. The individual method steps are apparent from the above description, and so reference is made to the explanations given above in this respect.

It goes without saying that, deviating from the above embodiment, in principle more than four supporting units 110 may be provided, coupled to one another by way of corresponding coupling devices 112 in order in the end to reproduce a support of the optical unit 106 in the manner of a three-point support. In this case, the coupling devices 112 may also be arranged in a cascaded manner, for example therefore the coupling devices 112 of two pairs of supporting units SEP may in turn be coupled by way of a corresponding coupling device 112.

For example, it may be provided for example that the third supporting unit 110.3 is assigned a further (fifth) supporting unit and is coupled to the third supporting unit by way of a further (second) coupling device 112, and so a further (second) supporting unit pair SEP is formed. The coupling and support for this further (second) supporting unit pair on the frame structure 109.1 can then take place analogously to the coupling and support between the two supporting units 110.1 and 110.2 of the (first) supporting unit pair SEP. In this case, the number of supporting units is then exactly five, with two of supporting unit pairs SEP being formed.

In a further variant, it may then be provided that a further (sixth) supporting unit is also assigned to the fourth supporting unit 110.4 and is coupled to the fourth supporting unit by way of a further (third) coupling device 112, and so a further (third) supporting unit pair SEP is formed. The coupling and support for this further (third) supporting unit pair on the frame structure 109.1 can then take place analogously to the coupling and support between the two supporting units 110.1 and 110.2 of the (first) supporting unit pair SEP. In this case, the number of supporting units is exactly six, with three supporting unit pairs SEP being formed.

Second Embodiment

Figure 5:
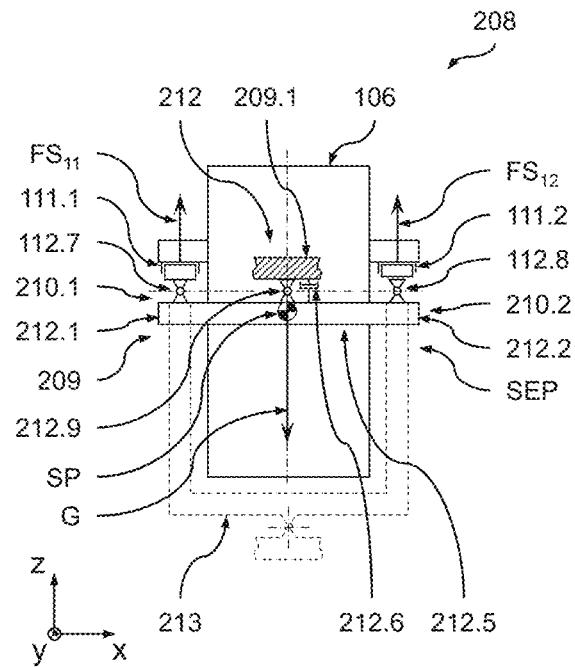
FIG. 5 is a schematic side view of a further embodiment of the arrangement according to the disclosure.

A further embodiment of the arrangement 208 according to the disclosure, which can be used instead of the arrangement 108 in the imaging device 101, is described below with reference to FIGS. 1, 4 and 5. The arrangement 208 corresponds in its basic design and functionality to the arrangement 108 from FIGS. 2 to 4, and so only the differences are to be discussed here. For example, identical components are provided with identical reference numerals, while similar components are provided with reference numerals increased by the value 100. Unless otherwise stated below, reference is made to the above statements in connection with the first embodiment with regard to the features, functions and aspects of these components.

The difference from the first embodiment is that the coupling device 212 is designed as a mechanical coupling device. The first coupling unit is in this case a first arm 212.1 of a rocker unit 212.5, which carries the first supporting unit 210.1. The second coupling unit is a second arm 212.2 of the rocker unit 212.5, which carries the second supporting unit 210.2. The first arm 212.1 and the second arm 212.2 are connected to one another in the region of a pivot bearing 212.9 of the rocker unit 212.5 in order to achieve a simple and reliable mechanical coupling of the two supporting units 210.1 and 210.2.

The connection between the first arm 210.1 and the second arm 210.2 may in principle be designed as desired, as long as the correspondingly desired compensating movement is achieved. In the present example, the first arm 210.1 and the second arm 210.2 are combined in one piece. The rocker unit 212.5 is in this case substantially U-shaped in plan view and is arranged to the side of the optical unit 106, as indicated in FIG. 4 by the dotted contour 212.5.

The rocker unit 212.5 is pivotably articulated on the frame unit 209.1 of the supporting structure 209 by way of the pivot bearing 212.9. The pivot bearing 212.9 of the rocker unit 212.5 may in principle be designed in any suitable manner. Here too, movements of the mounting in certain degrees of freedom that are involved in principle during the compensating movement can already be made available by the air bearing units 111.1 and 111.2. In the present example, the pivot bearing 212.9 of the rocker unit 212.5 restricts three translational degrees of freedom and two rotational degrees of freedom, since this achieves a particularly simple configuration. In other words, the pivot bearing 212.9 of the rocker unit 212.5 may therefore likewise be formed in the manner of a fixed bearing. The position of the pivot bearing 212.9 of the rocker unit 212.5 may in principle be selected as desired, it being possible in a simple manner for it to be adapted to the geometric conditions of the optical unit 106. The pivot bearing 212.7 of the rocker unit 212.5 may be arranged in the region of a connecting line of the pivot bearings 112.7 and 112.8, by way of which the respective air bearing unit 111.1 or 111.2 is articulated on the respectively associated coupling unit 212.1 and 212.2, respectively. In this way, undesired parasitic movements in the region of the pivot bearings 112.7 and 112.8 of the coupling units 212.1 and 212.2, respectively, can be largely avoided. This applies particularly if, as in the present example, the pivot axis of the pivot bearing 212.9 of the rocker unit 212.5 intersects this connecting line of the pivot bearings 112.7, 112.8 of the coupling units 212.1 or 212.2, respectively.

It goes without saying, however, that in other variants any other desired arrangement of the pivot bearing 212.9 and a different design of the rocker unit 212.5 can also be selected. For example, a substantially U-shaped design of the rocker unit with a swivel mounting may be provided below the optical unit 106, as is indicated in FIG. 5 by the dashed contour 213.

The first coupling unit 212.1 and the second coupling unit 212.2 are coupled to one another by way of the rocker unit 212.5 in such a way that a first displacement DS1 along the first supporting force $FS_{11}$ on the first air bearing unit 111.1 brings about an opposite second displacement DS2 along the second supporting force $FS_{12}$ on the second air bearing unit 111.2.

Here too, the ratio V between the supporting forces $FS_{11}$ and $FS_{12}$ of the two supporting units 210.1 and 210.2 of the supporting unit pair SEP can once again be set by way of the lever ratio between the first arm 212.1 and the second arm 212.2. In the present example, a ratio of V=1 is once again selected. For this purpose, the first arm 212.1 and the second arm 212.2 (or the supporting forces $FS_{11}$ and $FS_{12}$) have at least substantially the same effective lever arm with respect to the pivot bearing 212.9.

In this design, too, damping of the compensating movements on the supporting units 210.1 and 210.2 can once again be provided. For this purpose, the rocker unit 212.5 may include a damping device 212.6, which is connected between the rocker unit 212.5 and the frame structure 209.1, for damping the pivoting movement about the pivot bearing 212.9 of the rocker unit 212.5. It may once again be provided that the damping value of the damping device 212.6 is adjustable.

It goes without saying that the mechanical coupling device 212 described above may be a purely passive device. It is of course similarly conceivable that the coupling device 212 is an active device in which the compensating movements on the supporting units 210.1 and 210.2 are actively influenced. For example, the damping device 212.6 described above may correspondingly be formed as active. Similarly, the damping device 212.6 may be replaced or supplemented by a corresponding actuator.

Also with the design described above with the mechanical coupling device 212, a corresponding embodiment of the method according to the disclosure for supporting the optical unit 106 which is used during the imaging method with which the image of the mask structure of the mask 104.1 is projected onto the substrate 105.1 can be implemented during operation of the imaging device 101. The individual method steps are apparent from the above description, and so reference is made to the explanations given above in this respect.

Third Embodiment

Figure 6:
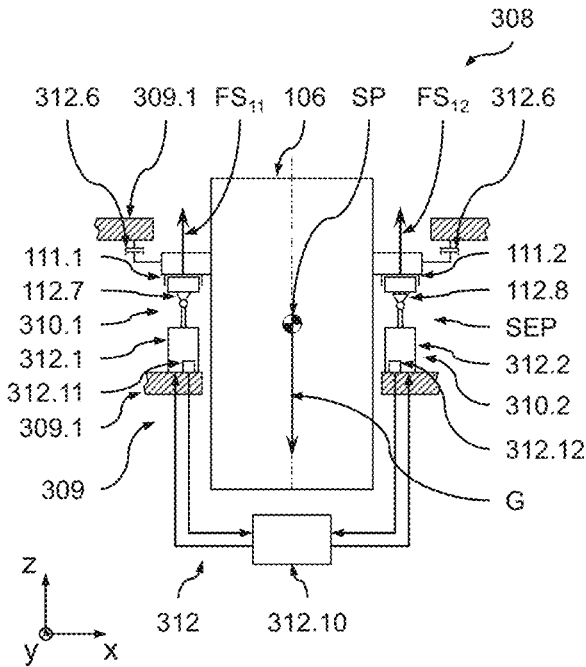
FIG. 6 is a schematic side view of a further embodiment of the arrangement according to the disclosure.

A further embodiment of the arrangement 308 according to the disclosure, which can be used in the imaging device 101 instead of the arrangement 108, is described below with reference to FIGS. 1 and 6. The arrangement 308 corresponds in its basic design and functionality to the arrangement 108 from FIGS. 2 to 4, and so only the differences are to be discussed here. For example, identical components are provided with identical reference numerals, while similar components are provided with reference numerals increased by the value 200. Unless otherwise stated below, reference is made to the above statements in connection with the first embodiment with regard to the features, functions and aspects of these components.

The difference from the arrangement 108 is that the coupling device 312 is an active coupling device. This can be desirable for example when it is intended that there should be a selective reaction to certain dynamic operating states of the arrangement 308 and the imaging device 101, respectively. The design of such an active coupling device 312 may in principle be implemented in any suitable manner. Any active components which actively generate the compensating movements on the supporting units 310.1 and 310.2 according to any operating principles may be provided.

In the present example, the first coupling unit of the first supporting unit 310.1 includes a first actuator unit 312.1, which is connected to a control device 312.10, while the second coupling unit of the second supporting units 310.2 includes a second actuator unit 312.2, which is also connected to the control device 312.10. Also in the present example, the respective air bearing unit 111.1 or 111.2 is articulated to the respectively associated coupling unit 312.1 or 312.2 by way of an associated pivot bearing 112.7 or 112.8. Accordingly, the first actuator unit 312.1 carries the first air bearing unit 111.1 displaceably along the first supporting force $FS_{11}$, while the second actuator unit 112.2 carries the second air bearing unit 111.2 displaceably along the second supporting force $FS_{12}$. The control device 312.10 then controls the first actuator unit 312.1 and the second actuator unit 312.2 for setting the first and second supporting force $FS_{11}$ and $FS_{12}$, respectively.

In order to achieve the desired force ratio V of the two supporting forces $FS_{11}$ and $FS_{12}$ here too, the coupling device 312 also generates a compensating movement in the region of the air bearings 111.1 and 111.2 in the present example. In the event that this force ratio should again be V=1, the gap width of the air gap is then the same in the region of the air bearings 111.1 and 111.2 with the same bearing pressure (air pressure in the air gap).

The control may in this case be formed both with and without a closed control loop. For example, it may thus be provided that the first actuator unit 312.1 and the second actuator unit 312.2 respectively include a force actuator controlled by the control device 312.10 (for example a Lorentz actuator), which generates a force in dependence on an input signal generated by the control device 312.10 (as a function of the input signal). In this case, an open control loop may be implemented, and hence therefore it may simply be provided that the control device 312.10 merely specifies an input signal for the force actuator, on the basis of which the force actuator sets the desired force. Here, the force actuator may generate the desired supporting force $FS_{11}$ or $FS_{12}$ on the supporting unit 310.1 or 310.2 of the supporting unit pair SEP directly. It may similarly be provided that the desired supporting force $FS_{11}$ or $FS_{12}$ is only made available by way of a corresponding transmission ratio.

In further variants of the active coupling device 312, a closed control loop may be provided. For this purpose, it may be provided for example that the control device 312.10 is connected to a first detection unit 312.11, which is configured to detect at least one first detection value EW1 assigned to the first coupling unit 312.1. Furthermore, the control device 312.10 is then connected to a second detection unit 312.12, which is configured to detect at least one second detection value EW2 assigned to the second coupling unit 312.2.

The respective detection value EW1 or EW2 may be in this case representative of a position of the assigned coupling unit 312.1 or 312.2 along the direction of the associated supporting force $FS_{11}$ or $FS_{12}$ and/or an amount of the assigned supporting force $FS_{11}$ or $FS_{12}$ and/or an air gap of the assigned air bearing unit 111.1 or 111.2. The control device 312.10 is then further configured to control the first and second actuator units 312.1 and 312.2 in dependence on the first and second detection values EW1, EW2 in order to achieve the desired ratio V of the two supporting forces $FS_{11}$ and $FS_{12}$.

Precisely in the case of such active coupling devices 312, it may once again be provided that the supporting structure includes a damping device 312.6 for damping the movements of the optical unit 106 generated by the actuator units 312.1 and 312.2. Here too, the damping value of the damping device 312.6 may once again be designed to be adjustable. The damping device 312.6 may be provided at any suitable point in the force flow between the supporting structure 309.1 and the optical unit 106. For example, the damping device 312.6 may be connectable to the optical unit 106, as in the present example.

In certain variants of the active coupling device 312, it may be provided that the control device 312.10 controls the actuator units 312.1 and 312.2 using a damping parameter DPM to dampen the movements of the optical unit 106 generated by the actuator units 312.1 and 312.2. Here too, the damping parameter DPM may for example be adjustable. Also with the design described above with the active coupling device 312, a corresponding embodiment of the method according to the disclosure for supporting the optical unit 106 which is used during the imaging method with which the image of the mask structure of the mask 104.1 is projected onto the substrate 105.1 can be implemented during operation of the imaging device 101. The individual method steps are apparent from the above description, and so reference is made to the explanations given above in this respect.

The present disclosure was described above exclusively on the basis of examples from the area of microlithography. However, it is understood that the disclosure can also be used in the context of any other optical applications, for example imaging methods at different wavelengths, in which similar problems arise in respect of the support of heavy optical units.

Furthermore, the disclosure can be used in connection with the inspection of objects, such as for example so-called mask inspection, in which the masks used for microlithography are inspected for their integrity, etc. In FIG. 1, a sensor unit, for example, which detects the imaging of the projection pattern of the mask 104.1 (for further processing), then takes the place of the substrate 105.1. This mask inspection can then take place substantially at the same wavelength as is used in the later microlithographic process. However, it is similarly possible also to use any desired wavelengths deviating therefrom for the inspection.

Finally, the present disclosure has been described above on the basis of specific exemplary embodiments showing specific combinations of the features defined in the following patent claims. It should expressly be pointed out at this juncture that the subject matter of the present disclosure is not restricted to these combinations of features, rather all other combinations of features such as are evident from the following patent claims also belong to the subject matter of the present disclosure.

What is claimed is:

1. A microlithographic arrangement, comprising:
   a supporting structure comprising four separate supporting units configured to support an optical unit,
   wherein:
   each supporting unit comprises an air bearing unit configured to provide a supporting force to counteract a gravitational force of the optical unit;
   two of the supporting units are coupled via a coupling device to define a supporting unit pair; and
   the coupling device is configured to counteract a deviation from a predeterminable ratio of the supporting forces of the two supporting units of the supporting unit pair.

2. The arrangement as claimed in claim 1, wherein at least one of the following holds:

the predeterminable ratio of the supporting forces is from ⅓ to 1/1;

the coupling device is configured to at least substantially equalize an amount of the supporting forces of the two supporting units of the supporting unit pair; and the coupling device is configured to reduce a deviation between amounts of the supporting forces of the two supporting units.

3. The arrangement of claim 1, wherein:

a first supporting unit of the supporting unit pair is configured to exert a first supporting force;

a second supporting unit of the supporting unit pair is configured to exert a second supporting force; and the coupling device is configured so that an amount the first supporting force deviates by less than 1.0% from an amount of the second supporting force.

4. The arrangement of claim 1, wherein:

a first supporting unit of the supporting unit pair comprises a first air bearing unit configured to generate a first supporting force;

a second supporting unit of the supporting unit pair comprises a second air bearing unit configured to generate a second supporting force;

the coupling device comprises a first coupling unit displaceably supporting the first air bearing unit along a direction of the first supporting force;

the coupling device comprises a second coupling unit displaceably supporting the second air bearing unit along a direction of the second supporting force; and the first and second coupling units are coupled to one another so that a first displacement along the direction of the first supporting force on the first air bearing unit brings about an opposite second displacement along the direction of the second supporting force on the second air bearing unit.

5. The arrangement of claim 4, wherein at least one of the following holds:

the amount of the first displacement is at least substantially equal to the amount of the second displacement; and for each of the first and second coupling units, the coupling unit is connected to the its air bearing unit via a first pivot bearing configured to restrict exactly three translational degrees of freedom and via a second pivot bearing configured to restrict exactly one translational degree of freedom.

6. The arrangement of claim 4, wherein:

the coupling device comprises a hydraulic coupling device;

the first coupling unit comprises a first piston-cylinder unit comprising a first hydraulic working space;

the second coupling unit comprises a second piston-cylinder unit comprising a second hydraulic working space; and the first and second hydraulic working spaces are hydraulically coupled to one another.

7. The arrangement of claim 6, wherein at least one of the following holds:

the two piston-cylinder units have an at least substantially identical effective piston area;

the first and second hydraulic working spaces are coupled to one another via at least one hydraulic line;

a throttle device is between the first and second hydraulic working spaces to provide adjustable throttling; and the coupling device comprises a pumping device configured to actively fill the first and second hydraulic working spaces.

8. The arrangement of claim 4, wherein:

the coupling device comprises a mechanical coupling device;

the first coupling unit comprises a first arm of a rocker unit;

the second coupling unit comprises a second arm of the rocker unit; and the first and second arms are connected to one another in a region of a pivot bearing of the rocker unit.

9. The arrangement of claim 8, wherein at least one of the following holds:

the first and second arms are in one piece;

the pivot bearing of the rocker unit is configured to restrict three translational degrees of freedom and two rotational degrees of freedom;

the pivot bearing of the rocker unit is in a region of a connecting line of the pivot bearings of the coupling units; and the rocker unit comprises a damping device configured to damp pivoting movement about the pivot bearing of the rocker unit.

10. The arrangement of claim 4, wherein:

the coupling device comprises an active coupling device;

the system further comprises a control device;

the first coupling unit comprises a first actuator unit connected to the control device;

the second coupling unit comprises a second actuator unit connected to the control device; and the control device is configured to control the first and the second actuator units to set the first and second supporting forces.

11. The arrangement of claim 10, wherein at least one of the following holds:

for each of the first and second actuator units, the actuator unit comprises a force actuator controllable via the control device;

the supporting structure comprises a damping device configured to damp movement of the optical unit generated via the actuator units; and the control device is configured to control the actuator units via a damping parameter to damp movements of the optical unit generated via the actuator units.

12. The arrangement of claim 10, wherein:

the control device is connected to a first detection unit configured to detect a detection value assigned to the first coupling unit;

the control device is connected to a second detection unit configured to detect a second detection value assigned to the second coupling unit;

a respective detection value is representative of a position of the assigned coupling unit along the direction of the assigned supporting force and/or an amount of the assigned supporting force and/or an air gap of the assigned air bearing unit; and the control device is configured to control the first and second actuator units in dependence on the first and second detection values.

13. The arrangement of claim 1, wherein:

the optical unit has a center of gravity;

the gravitational force of the optical unit and the supporting forces of the supporting units intersect a horizontal plane at a force intersection;

one of the two supporting units of the at supporting unit pair has a force intersection in the horizontal plane that is a smallest distance from the force intersection of the gravitational force.

14. The arrangement of claim 13, wherein at least one of the following holds:
   the other of the two supporting units of the supporting unit pair has a force intersection in the horizontal plane that is a second smallest distance from the force intersection of the gravitational force;
   the optical unit defines a circumferential direction in the horizontal plane; and
   the force intersections of the two supporting units of the supporting unit pair are directly adjacent to one another in the circumferential direction.

15. The arrangement of claim 1, wherein one of the following holds:
   the arrangement comprises exactly four supporting units;
   the arrangement comprises at least five supporting units, and the supporting units define two supporting unit pairs; and
   the arrangement comprises exactly six supporting units, and the supporting units define three supporting unit pairs.

16. The arrangement of claim 1, wherein the optical unit has a mass of from 4 t to 14 t.

17. An optical imaging device, comprising:
   an illumination device comprising a first optical element group;
   a projection device comprising a second optical element group; and
   an image device,
   wherein:
      the illumination device is configured to illuminate an object;
      the projection device is configured to project an image of the object onto the image device; and
      a member selected from the group consisting of the illumination device and the projection device comprises an arrangement according to claim 1.

18. The optical imaging device of claim 17, wherein the optical imaging device is an EUV microlithography optical imaging device.

19. A method, comprising:
   supporting an optical unit via at least four separate supporting units of a supporting structure, each supporting unit comprising an air bearing unit that generates a supporting force that counteracts a gravitational force of the optical unit,
   wherein:
      two of the supporting units are coupled via a coupling device to define a supporting unit pair; and
      the coupling device counteracts a deviation from a predeterminable ratio of the two supporting forces of the two supporting units of the supporting unit pair.

20. The method of claim 19, wherein:
   the supporting structure is a component of at least one member selected from the group consisting of an illumination device and a projection device; and
   the method further comprises:
      using the illumination device to illuminate an object, the illumination device comprising a first optical element group; and
      using the projection device to generate an image of the object on an image device, the projection device comprising a second optical element group.

* * * * *

UNITED STATES PATENT AND TRADEMARK OFFICE
CERTIFICATE OF CORRECTION

PATENT NO. : 11,307,503 B2
APPLICATION NO. : 17/135870
DATED : April 19, 2022
INVENTOR(S) : Vogt et al.

It is certified that error appears in the above-identified patent and that said Letters Patent is hereby corrected as shown below:

In the Claims

Column 19, Line 42, Claim 5, delete "the its" and insert -- its -- therefore;

Column 20, Line 64, Claim 13, delete "at".

Signed and Sealed this
Second Day of August, 2022

Katherine Kelly Vidal
*Director of the United States Patent and Trademark Office*